United States Patent [19]
Morris

[11] Patent Number: 4,912,347
[45] Date of Patent: Mar. 27, 1990

[54] CMOS TO ECL OUTPUT BUFFER

[75] Inventor: Bernard L. Morris, Allentown, Pa.

[73] Assignee: American Telephone and Telegraph Company, AT&T Bell Laboratories, Murray Hill, N.J.

[21] Appl. No.: 89,284

[22] Filed: Aug. 25, 1987

[51] Int. Cl.[4] .................. H03K 19/092; H03K 19/02; G05F 3/16

[52] U.S. Cl. .................................... 307/475; 307/443; 307/446; 307/448; 323/317

[58] Field of Search .............................. 323/315–317; 307/443, 446, 448, 475

[56] References Cited

U.S. PATENT DOCUMENTS

| | | |
|---|---|---|
| 4,437,171 | 3/1984 | Hudson et al. |
| 4,533,842 | 8/1985 | Yang et al. |
| 4,645,951 | 2/1987 | Uragami |
| 4,656,372 | 4/1987 | Sani et al. |
| 4,656,375 | 4/1987 | Lauffer et al. |
| 4,701,642 | 10/1987 | Pricer ................................. 307/446 |
| 4,717,869 | 1/1988 | Koch et al. ........................ 323/316 |

OTHER PUBLICATIONS

"Extended Abstracts", vol. 87-1, Abstract No. 273, Bi-CMOS Interface Circuit in Mixed CMOS/TTL and ECL Use Environment, Toshiba Corporation, Semiconductor Division, Yasuhiro Sugimot, Hiroyuki Hara.
"Session XVIII: Static RAMs, Fam18.1: An ECL Compatible 4K CMOS RAM", Edwin L. Hudson and Stephen L. Smith, Intel Corp., Santa Clara, Calif., ISSCC 82/ Friday, Feb. 12, 1982/Continental Ballrooms 5-9/9:00 a.m.
"13-ns, 500-mW, 64-kbit ECL RAM Using Hi-BIC-MOS Technology," IEEE, 1986, 0018-9200/86/10-00-0681 $01.00, pp. 681 and 683, Authors: K. Ogiue, M. Odaka, S. Miyaoka, I. Masuda, T. Ikeda and K. Tonomura.

Primary Examiner—John Zazworsky
Assistant Examiner—M. R. Wambach
Attorney, Agent, or Firm—Scott W. McLellan

[57] ABSTRACT

A circuit is disclosed which converts CMOS logic input signals to ECL output signals. A pair of FETs, arranged as a conventional CMOS inverter, responds to the CMOS logic input signals and drives a bipolar transistor operating as a voltage follower. The emitter of the bipolar transistor serves as the output of the buffer providing the ECL output signals. A resistor having a predetermined resistance couples between a voltage source and the base of the bipolar transistor. First one of the pair of FETs couples a constant current source to the resistor and the base of the bipolar transistor when the buffer is supplying an ECL logical "zero" logic signal. The current from the current source passing through the resistor establishes the ECL logical "zero" output voltage. Second one of the pair of FETs shunts the resistor when the buffer is supplying an ECL logical "one" output, allowing faster transitioning of the output of the buffer from an ECL logical "zero" to a logical "one". Further, the current from the current source compensates for variations in the resistance of the resistor to assure a substantially constant difference between the ECL logical "one" and the ECL logical "zero" output voltages with variations in the resistance of the resistor from the manufacture thereof.

18 Claims, 1 Drawing Sheet

CMOS TO ECL OUTPUT BUFFER

FIELD OF THE INVENTION

This invention relates generally to output buffers, and more particularly, to complementary metal-oxide semiconductor logic level to emitter-coupled logic logic level output buffers.

BACKGROUND OF THE INVENTION

Emitter-coupled logic (ECL) is the pre-eminent logic family where high-speed operation is the overriding requirement. For example, the fastest computers available utilize ECL in the computational portions thereof. In contrast, complementary metal-oxide-semiconductor (CMOS) logic has been traditionally thought of as low-speed and low-power logic family. However, recent advances in CMOS circuit design and processing technology is narrowing the speed gap between ECL and CMOS logic while retaining the low-power feature of CMOS logic. As CMOS logic circuits approach the speed of ECL circuits, new designs, and redesigns of existing systems, that would traditionally require ECL are now utilizing CMOS logic circuits with little or no sacrifice in performance—with the added benefit of lower power dissipation. The lower power dissipation of CMOS logic allows greater integration density, hence more compact systems are produced. In redesign applications where ECL is replaced with CMOS logic, the above benefits are still obtained, but frequently the new CMOS logic must still interface with existing "peripheral" or "glue" ECL circuits. This involves converting the ECL logic levels (approximately −0.9 volts for a logic "one" and −1.8 volts for a logic "zero") to CMOS logic levels (typically greater than one-half the power supply voltage volts for a logic "one" and less than one-half the power supply voltage for a logic "zero") by an input buffer and converting the CMOS logic levels back to ECL logic levels by an output buffer.

One design of a CMOS to ECL output buffer circuit is described in U.S. Pat. No. 4,656,372. In FIG. 1, the output buffer is four series-coupled field effect transistors (FETs), similar to a conventional CMOS inverter, with two of the FETs (22, 23) adapted to provide output voltage level shifting. The series coupled FETs increase the output impedance, thereby reducing the speed of the buffer. Further, the design is limited to −3 volts power supply instead of the standard −4.5 to −5.2 volt power supply, and requires over-sized FETs to provide sufficient current sourcing capacity.

An alternative CMOS to ECL output buffer design is disclosed in U.S. Pat. No. 4,645,951. In its simplest configuration (FIG. 1,) a CMOS logic signal from CMOS logic 20 drives field-effect transistor F5. Transistor F5 operates as a switch for selectively coupling current source Is to resistor R5 and to the base of output transistor Q5. When transistor F5 is conducting, the voltage drop across load resistor R5, due to the current from current source Is flowing therein, is buffered by transistor Q5 to provide the ECL "zero" logic level at the emitter of transistor Q5. When transistor F5 is not conducting, load resistor R5 pulls up the base of transistor Q5 such that the emitter of transistor Q5 has the ECL logical "one" thereon. By relying on the load resistor R5 to pull-up the base of transistor Q5, the speed of the output buffer suffers due to the time required for charging the parasitic capacitances of transistors F5, Q5 and the load resistor R5 itself.

Still another CMOS to ECL output buffer is disclosed in FIG. 4 of U.S. Pat. No. 4,437,171. This complex circuit relies on the voltage drop across series resistors 70 and 71 to establish the output voltage for an ECL logical "zero." As such, the ECL logical "zero" output voltage is dependent upon the power supply input voltage (Vee), requiring tight regulation of the Vee supply.

The published speciications for the ECL logic voltage levels are very tight and to optimize the speed of the interface between CMOS and ECL circuits, the ECL voltage specifications must be closely adhered to. In particular, the voltage difference between the ECL logical "one" and logical "zero" is very tightly specified, and is substantially invariant with temperature. However, the output voltage from prior art output buffers varies with temperature and processing variations during manufacturing. For example, the output buffer disclosed in U.S. Pat. No. 4,645,951, described above, suffers from this problem. Due to the manufacturing processes alone, the resistance of the load resistor R5 can have wide variations, typically thirty to forty percent. This, with current source Is providing a predetermined constant current, causes corresponding variations in the ECL logical "zero" output voltage which could exceed the specifications for the ECL logical "zero" voltage and the voltage difference between logical levels.

In FIG. 2 of U.S. Pat. No. 4,533,842, a current source which tracks variations in resistance of a load resistor is disclosed. Here, transistor 36, resistor 47 and voltage source Vcs form a constant current source, the sourced current through the collector transistor 36 being established by the voltage Vcs and the resistor 47. However, transistor 36 is a bipolar device, and to insure high-speed operation, the current through the collector of transistor 36 must not be allowed to fall to zero; to do so would force transistor 36 into saturation, requiring substantial recovery time should it be desired to have transistor 36 resupply current. Hence, a differential stage of transistors 32 and 33 switch the current flowing from transistor 36 between them through corresponding load resistors 45, 46, keeping a constant current flowing through transistor 36. Since a large current is flowing in transistor 36 at all times, this type of current source suffers from high power dissipation. With a large number of output stages on a chip, a very substantial amount of power must be dissipated.

Another approach to stabilization of the output voltage is addressed in U.S. Pat. No. 4,656,375. Here an unused ECL gate is utilized to generate the supply voltages (Va, Vb) to a conventional CMOS inverter acting as the CMOS to ECL output buffer. However, this design suffers from the same drawbacks the design in U.S. Pat. No. 4,464,372, described above, does with the additional drawback of the need for several power supply voltages: Vcc, Vss and Vee, as well as Va and Vb. The multiplicity of power supplies adversely impacts the number of pins available for data signals, etc., on a package containing such circuitry. Further, additional external power supply filtering is required (the one microfarad capacitors.)

SUMMARY OF THE INVENTION

An improved CMOS to ECL output buffer is disclosed providing low propagation delay, low power dissipation, ECL output voltages substantially independent of the power supply voltage and better performance with variations in device charcteristics. The buffer translates CMOS logic input signals to ECL output signals on an output node, includes- a current source (17) coupled to a first power source (Vss); a first transistor (16) of a first conductivity type, responsive to the CMOS logic input signals, for selectively coupling the current source to an intermediate node; a first resistor having a predetermined resistance R18 and coupling between a second power source (Vcc) and the intermediate node; and, a bipolar transistor (19) having a base, collector and emitter, the collector coupling to the second power source, the base coupling to the intermediate node and the emitter coupling to the output node; characterized by a second transistor (14) of a second conductivity type, responsive to the CMOS logic input signals, for selectively coupling the intermediate node to the second power source. The second transistor shunts the first resistor to allow faster transitioning of the output signals from an ECL logical "zero" to a logical "one." The current source provides a current such that the voltage across the first resistor from the current passing therein establishes the ECL logical "zero" output voltage. The current from the current source also tracks variations in the resistance of the first resistor to maintain the voltage difference between an ECL logical "one" and an ECL logical "zero" output voltage essentially constant. Further, the current source consumes less power than prior art current sources and may be shared among several output buffers.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
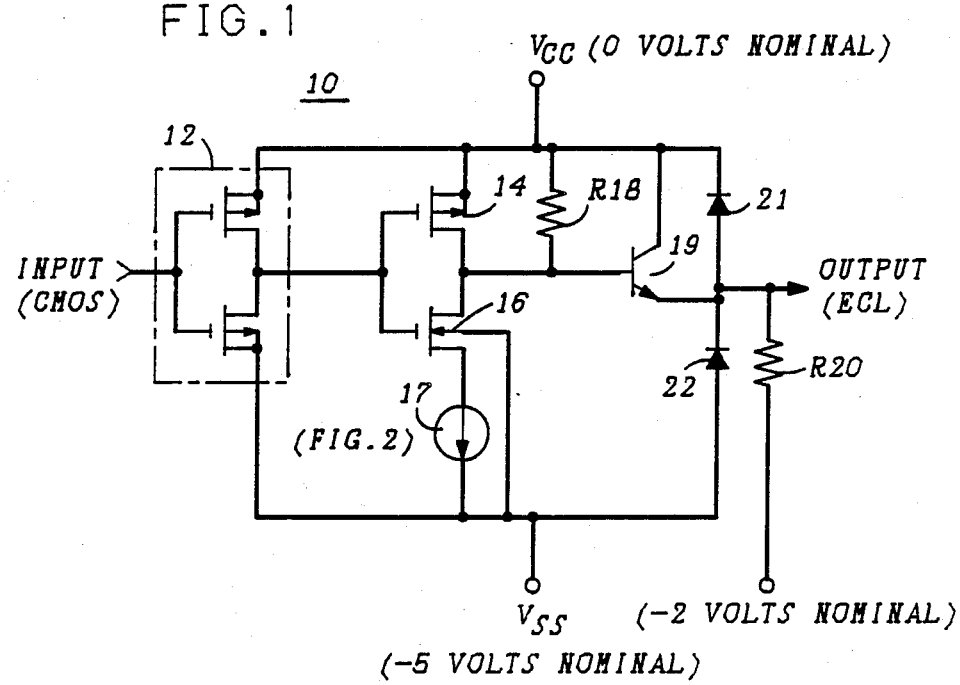
FIG. 1 is a schematic diagram of the output buffer.

Referring to FIG. 1, the improved complementary metal-oxide-semiconductor (CMOS) to emitter-coupled logic (ECL) output buffer 10 is diagrammed. It is noted that ECL circuits operate with a positive supply voltage (Vcc) of substantially zero volts, or ground, and a negative supply voltage (Vss) between $-4.5$ and $-5.2$ volts, here a nominal $-5$ volts. In addition, CMOS logic circuits typically operate with five volts of power; hence in systems consisting of mixed ECL and CMOS logic, the CMOS logic uses the ECL power sources to avoid providing for a positive five volt supply. Therefore, for purposes here, CMOS logic (not shown) driving the output buffer 10 operates with power sources of substantially zero and $-5$ volts, a logical "one" being a voltage greater than $-2.5$ volts and a logical "zero" being a voltage less than $-2.5$ volts. The logic signals from the CMOS logic (not shown) drives a CMOS inverter 12 which in turn drives the gates of transistors 14, 16. Inverter 12 performs a logical inversion so that the output buffer 10 does not logically invert data passing through it. It is understood, however, that the inverter 12 can be eliminated if the logical inversion so provided is compensated for in the CMOS logic (not shown) or any ECL circuitry (not shown) that couples to the output of the buffer 10. Transistors 14, 16 are configured to form a CMOS inverter similar to inverter 12. However, instead of being coupled to the Vss power supply, transistor 16 couples to a current source 17 which in turn couples to Vss. The drains of transistors 14, 16 couple together toform an output which drives resistor R18 and the base of transistor 19. Transistor 19 is arranged in an emitter (voltage) follower configuration with the collector thereof coupled to Vcc (zero volts). The emitter of transistor 19 follows the voltage on the base less one forward biased diode drop, approximately 0.8 volts. A resistor R20, having an exemplary resistance of 50 ohms and not part of the buffer 10, serves for purposes here as an load for the buffer 10, pulling the emitter of transistor 19 down. It is understood that the resistor R20 can be replaced with an ECL circuit as the load to the buffer 10. Diodes 21, 22 are protection diodes used to clamp any electrostatic discharge applied to the output of the buffer 10 to protect same from damage.

Examplary operation of the buffer 10 is as follows. When the input to the inverter 12 is a logical "one," the output thereof is a logical "zero" and is substantially equal to the Vss power supply voltage, here $-5$ volts. This cuts-off transistor 16 and enables transistor 14 to conduct. With transistor 14 conducting, the base of transistor 19 couples to Vcc. Due to the relatively high current into load R20 from transistor 19 when sourcing an ECL logical "one" (approximately 22 milliamperes) and the finite current gain of the transistor 19 (as low as 50,) substantial current flows into the base of transistor 19, that current resulting in approximately 100 millivolts of drop across the parallel combination of resistor R18 and transistor 14. Therefore, with the base of transistor 19 at $-100$ millivolts combined with the 0.8 volt base-emitter drop, the emitter of transistor 19, and hence the output of the buffer 10, has a voltage thereon of approximately $-0.9$ volts, an ECL logical "one." Conversely, when the input to inverter 12 is a logical "zero," the output of inverter 12 is a logical "one" and is substantially equal to the Vcc power supply voltage, or zero volts. This cuts-off transistor 14 and enables transistor 16 to conduct, coupling current source 17 to resistor R18 and to the base of the transistor 19. The current source 17 will be described in more detail below, but for purposes here, the current supplied by source 17 is sufficient to provide a voltage drop across resistor R18 that, combined with the 0.8 volt base-emitter drop of transistor 19, the emitter thereof has the ECL logical "zero" voltage thereon, $-1.8$ volts. The resulting drop across resistor R18 is approximately one volt, or the voltage difference between an ECL logical "one" ($-0.9$ volts) and an ECL logical "zero"($=1.8$ volts,) less the 100 millivolts offset due to current drawn into the base of transistor 19 when said is providing an ECL logical "one." Since the current through the base of transistor 19 is insignificant with the relatively low current supplied to the load R20 by the transistor 19 when sourcing a logical "zero" (approximately 4 milliamperes through load R20,) the voltage on the emitter of the transistor 19 is one diode drop below the $-1$ volt on the base, resulting in $-1.8$ volts thereon, the ECL logical "zero" voltage. Exemplary values for resistor R18 and current source 17 is 500 ohms and 2 milliamperes, respectively, It is noted that transistor 14 allows fast recovery of the buffer 10 when transitioning from a logical "zero" to a logical "one" by eliminating the resistor R18 as the sole means of pulling the base of transistor 19 up. Further, the combination of the current source 17 and the resistor R18 allows the precise control of the voltage difference between the ECL logical "one" and the ECL logical "zero" output voltages.

Figure 2:
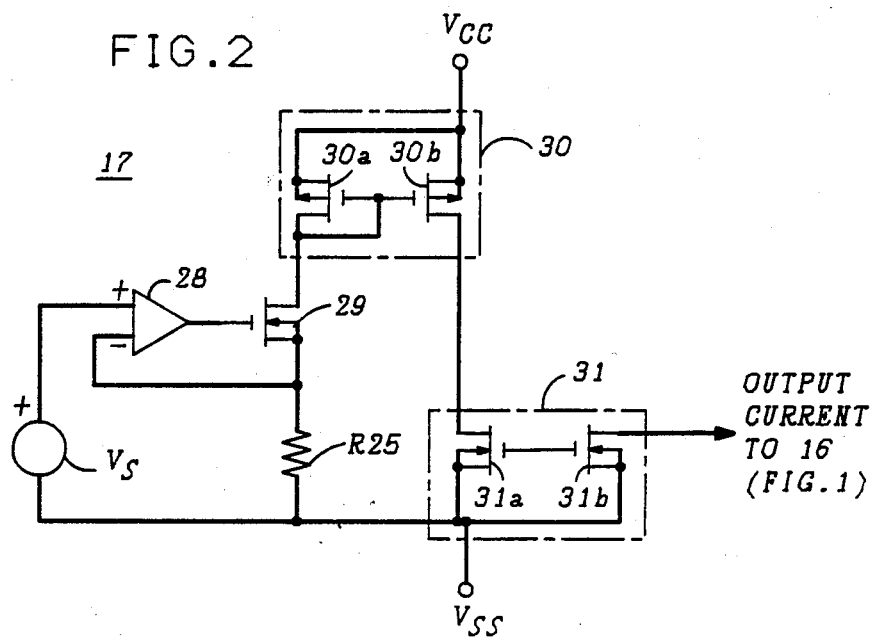
FIG. 2 is a schematic diagram of a current source used in the output buffer of FIG. 1.

In FIG. 2, the current source 17 (FIG. 1) that allows the precise control of the output voltage difference from buffer 10 (FIG. 1) is diagrammed in detail. The current source 17 must track variations in resistance of resistor R18 (FIG. 1,) due to operating temperature and processing variations during manufacturing, to achieve the precise control. Further, the current source 17 must operate with low power and not delay recovery from having the current flowing therein cut-off. Current source 17 accomplishes this by using a resistor R25 to match variations in the resistance of resistor R18 and by using FET type current mirrors that magnify the current flowing therein. The relationship between resistor R18 and resistor R25 will be discussed in more detail below, but for purposes here, resistor R25 is essentially identical to resistor R18 except its resistance. A voltage source Vs, for illustrative purposes here a band-gap voltage reference with an output voltage of approximately 1.3 volts above Vss, drives the non-inverting input of operational amplifier 28. It is noted that the voltage source Vs could be any one of a number of suitable voltage sources, such as a Zener diode voltage reference. Output from the operational amplifier drives the gate of transistor 29, operating as a source or voltage follower. The inverting input of operational amplifier 28 couples to the source of transistor 29 and to resistor R25. In this configuration, due to the high open-loop gain of the operational amplifier 28, the source of the transistor 29 has substantially the same voltage thereon as the voltage source Vs provides. The voltage on the source of transistor 29 causes current to flow through resistor R25, the current being mirrored by first current mirror 30 and then by second current mirror 31. The two current mirrors 30, 31 allow magnification of the mirrored currents, by scaling the dimensions of the field-effect transistors 30a, 30b, 31a, 31b, in the current mirrors 30, 31, and proper voltage supply referencing of the output current to transistor 16 (FIG. 1.) Exemplary width to length ratios of transistors 30a, 30b are both 100:10 and transistors 31a, 31b are 20:4 and 200:4, respectively. This yields a a current magnification factor of 1 for current mirror 30 and a magnification factor of 10 for current mirror 31. It is noted that the mirrors 30, 31 are shown here as Widlar mirrors, but other designs, such as Wilson mirrors, could be used. With exemplary values of 6.5 kilo-ohms for resistor R25 and 1.3 volts for voltage source Vs, a nominal current of 200 microamperes flows through resistor R25. The 200 microamperes current is magnified by mirrors 30, 31 to provide the 2 milliamperes current of current source 17 (FIG. 1) for buffer 10 (FIG. 1.) It is noted that this structure obviates the saturation problem associated with bipolar transistor current sources. Hence, the buffer 10 does not need to provide a current path for current from the current source 17 at all times, but only when buffer 10 is supplying an ECL logical "zero". This lessens the power dissipation of the buffer 10. Still further, the current mirror 31 can be adapted to provide current for a plurality of output buffers 10 without having to duplicate resistor R15, amplifier 28, transistor 29 and current mirror 30.

The tracking of the output current of the current source 17 with the change of resistance of the resistor R18 (FIG. 1) is best illustrated by comparing the effects of varying the resistances of resistors R25 and R18. As stated above, resistor R18 and resistor R25 are essentially identical, except for resistance, and the voltage drop across resistor R18 when the buffer 10 (FIG. 1) is sourcing an ECL logical "zero" is to be approximately one volt. The voltage is not to deviate with circuit fabrication (processing) variations changing the resistance of resistor R18. Resistors R18, R25 are, for purposes here, diffused regions (not shown) in the integrated circuit substrate (not shown) embodying the buffer 10 (FIG. 1) with the lengths of the regions determining the resistance of that region. Typical percentage variations in resistance of resistor R18, and therefore resistor R25, is anywhere between 30% and 40% from nominal, the variation being nearly identical for both resistors. It is understood that other technologies exist for creating resistors, such as depositing resistive material on the substrate, but such techniques are expensive and do not obviate the need for tracking variations in the resistance of resistor R18. Recognizing that the output current of current source 17 is:

$$M1M2(Vs/R25);$$

where M1 is the magnification factor or current mirror 30, M2 is the magnification factor of current mirror 31, Vs is the voltage from voltage source Vs and R25 is the resistance of resistor R25. The voltage drop across resistor R18 with current from current source 17 is the product of the resistance of resistor R18 and the current from current source 17. Therefore, combining the equations yields the voltage drop across resistor R18 to be:

$$M1M2(Vs)(R18/R25);$$

where R18 is the resistance of resistor R18. The ratio of resistances of resistors R18, R25 in establising the voltage drop across resistor R18, and not the resistance of the resistors individually, essentially eliminates the effect of the percentage variation of resistance with processing. Using the exemplary values and equations from above:

$$M1 = 1,$$

$$M2 = 10,$$

$$Vs = 1.3 \text{ volts},$$

$$R18 = 500 \text{ ohms, and}$$

$$R25 = 6500 \text{ ohms},$$

yields the desired voltage drop of one volt across R18, which when added to the 0.8 volt base to emitter drop of transistor 19 (FIG. 1), the output of buffer 10 is $-1.8$ volts.

It is noted that the output current from current source 17 is substantially indpendent of the power supply voltage (Vee.) Therefore, the output voltage from the buffer 10 (FIG. 1) is also substantially independent of the power supply voltage, allowing wide variations of the power supply voltage with no impact in performance. The capability to operate with different power supply voltages allows the output buffer 10 to be compatible with the many different ECL families.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. In an integrated circuit, a circuit for converting CMOS logic input signals from a source thereof to ECL output signals, having:
   a current source (17) coupled to a first power source (Vss);
   a first transistor (16) of a first conductivity type, having a control electrode and first and second outputs, the control electrode having the CMOS logic input signals thereon, the first output coupling to the current source and the second output coupling to an intermediate node;
   a first resistor having a predetermined resistance R18 and coupling between a second power source (Vcc) and the intermediate node; and,
   a bipolar transistor (19) having a base, collector and emitter, the collector coupling to the second power source, the base coupling to the intermediate node and the emitter coupling to an output node; characterized by
   a second transistor (14) of a second conductivity type, having a control electrode and first and second outputs, the control electrode having theCMOS logic input signals thereon, the first output coupling to the second power source and the second output coupling to the intermediate node;
   wherein the first power source has a potential less than the second power source, and the output node has thereon the ECL output signals.

2. The circuit recited in claim 1, wherein the current source provides a current which varies in correspondence with variations in the resistance of the first resistor, such that the voltage drop across the first resistor, in response to the current from the current source, is substantially constant with the variations in the resistance of th first resistor.

3. The circuit recited in claim 2, wherein the current source is characterized by:
   a voltage source supplying a constant voltage Vs referenced to the first power source;
   an amplifier (28) having an output, inverting and non-inverting inputs, the non-inverting input coupled to the voltage source;
   a third transistor (29) having a control electrode, first and second outputs, the control electrode coupling to the output of the amplifier, the first output coupling to the inverting input of the amplifier;
   a second resistor having a predetermined resistance R25, coupling between the first output of the FET and the first power source;
   a first current mirror (30), having an output and a current magnification factor M1, coupling between the second power source and the second output of the transistor; and
   a second current mirror (31), having an output and a current magnification factor M2, coupling between the first power source output and the first current mirror;
   wherein the second current mirror provides the output current of the current source according to:

M1M2(Vs/R25)

where M1 is the current magnification factor of the first current mirror and M2 is the current magnification factor of the second current mirror.

4. The circuit recited in claim 3, wherein the first current mirror is composed of field effect transistors of the second conductivity type and the second current mirror is composed of field effect transistors of the first conductivity type.

5. The circuit recited in claim 4, wherein the amplifier is an operational amplifier.

6. The circuit recited in claim 5, wherein the third transistor is a field-effect transistors of the first conductivity type.

7. The circuit recited in claim 6, wherein transistors of the first conductivity type are N-channel field-effect transistors, transistors of the second conductivity type are P-channel field-effect transistors and the bipolar transistor is and NPN bipolar transistor.

8. The circuit recited in claim 7, wherein the threshold voltage of the combination of the first and second transistors are approximately one-half the voltage difference between the second power source and the first power source.

9. The circuit recited in claim 8, wherein the first power source has a voltage between −4.5 and −5.2 volts and the second power source has a voltage essentially at zero volts (ground.).

10. The circuit recited in claim 9, wherein a CMOS inverter circuit is disposed between the source of CMOS logic input signals and the control electrodes of the first and second FETs.

11. In an integrated circuit, a buffer circuit for converting CMOS logic input signals to ECL output signals, having:
   a current source (17) coupled to a first power source (Vss);
   a first transistor (16) of a first conductivity type, having a control electrode and first and second outputs, the control electrode having the CMOS logic input signals thereon, the first output coupling to the second power source and the second output coupling to the intermediate node;
   a first resistor having a predetermined resistance (R18) and coupling between a second power source (Vcc) and the intermediate node; and,
   a bipolar transistor (19) having a base, collector and emitter, the collector coupling to the second power source, the base coupling to the intermediate node and the emitter coupling to an output node;
   the current source characterized by:
   a voltage source supplying a constant voltage Vs referenced to the first power source;
   an amplifier (28) having an output, inverting and non-inverting inputs, the non-inverting input coupled to the voltage source;
   a second transistor (29) having a control electrode, first and second outputs, the control electrode coupling to the output of the amplifier, the first output coupling to the inverting input of the amplifier;
   a second resistor having a predetermined resistance R25 and coupling between the first output of the transistor and the first power source;
   a first current mirror (30), having an output and a current magnification factor M1, coupling between the second power source and the second output of the transistor, and
   a second current mirror (31), having an output and a current magnification factor M2, coupling between the first power source output and the first current mirror;

wherein the second current mirror provides the output current of the current source according to:

M1M2(Vs/R25).

12. The buffer circuit recited in claim 11, wherein the first current mirror is composed of field effect transistors of the second conductivity type and the second current mirror is composed of field effect transistors of the first conductivity type.

13. The buffer circuit recited in claim 12, wherein the amplifier is an operational amplifier.

14. The buffer circuit recited in claim 13, wherein the second transistor is a field-effect transistor of the first conductivity type.

15. The buffer circuit recited in claim 14, further characterized by a third field-effect transistor (14) of a second conductivity type, having a control electrode and first and second outputs, the control electrode having the CMOS logic input signals thereon, the first output coupling to the second power source and the second output coupling to the intermediate node.

16. The buffer circuit of recited in claim 15, wherein transistors of the first conductivity type are N-channel field-effect transistors, the second transistor is a P-channel field-effect transistor and the bipolar transistor is a silicon NPN bipolar transistor.

17. The circuit recited in claim 16, wherein the threshold voltage of the combination of the first and second transistors are approximately one-half the voltage difference between the second power source and the first power source.

18. The circuit recited in claim 17, wherein the first power source has a voltage between $-4.5$ and $-5.2$ volts and the second power source has a voltage essentially at zero volts (ground.).

* * * * *